(12) United States Patent
Wang et al.

(10) Patent No.: US 7,923,815 B2
(45) Date of Patent: Apr. 12, 2011

(54) DRAM HAVING DEEP TRENCH CAPACITORS WITH LIGHTLY DOPED BURIED PLATES

(75) Inventors: Geng Wang, Stormville, NY (US); Kangguo Cheng, Guilderland, NY (US); Johnathan E. Faltermeier, Delanson, NY (US); Paul C. Parries, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/969,986

(22) Filed: Jan. 7, 2008

(65) Prior Publication Data

US 2009/0174031 A1 Jul. 9, 2009

(51) Int. Cl.
*H01L 21/02* (2006.01)
(52) U.S. Cl. ......... 257/532; 257/E29.342; 257/E29.346; 257/E21.396; 438/386; 438/389; 438/243
(58) Field of Classification Search .................. 257/301, 257/E21.396, 532, E29.342, E29.346; 438/243, 438/149, 386, 389, 246
See application file for complete search history.

(56) References Cited

U.S. PATENT DOCUMENTS

| | | | |
|---|---|---|---|
| 3,387,286 A | 6/1968 | Dennard | |
| 4,688,063 A | 8/1987 | Lu et al. | |
| 5,047,815 A * | 9/1991 | Yasuhira et al. | 257/303 |
| 6,001,684 A | 12/1999 | Shen | |
| 6,316,310 B1 | 11/2001 | Wensley et al. | |
| 6,509,226 B1 | 1/2003 | Jaiprakash et al. | |
| 6,566,191 B2 | 5/2003 | Hsu et al. | |
| 6,738,300 B2 | 5/2004 | Barth, Jr. | |
| 6,831,997 B2 * | 12/2004 | Kamon | 382/144 |
| 6,847,076 B1 | 1/2005 | Tsou et al. | |
| 7,141,853 B2 * | 11/2006 | Campbell et al. | 257/347 |
| 7,388,244 B2 * | 6/2008 | Ho et al. | 257/301 |
| 7,554,148 B2 * | 6/2009 | Su et al. | 257/301 |
| 2005/0280063 A1 * | 12/2005 | Cheng et al. | 257/301 |

* cited by examiner

*Primary Examiner* — Zandra Smith
*Assistant Examiner* — Paul E Patton
(74) *Attorney, Agent, or Firm* — Joseph P. Abate; Howard M. Cohn

(57) ABSTRACT

By controlling buried plate doping level and bias condition, different capacitances can be obtained from capacitors on the same chip with the same layout and deep trench process. The capacitors may be storage capacitors of DRAM/eDRAM cells. The doping concentration may be less than $3E19 cm^{-3}$, a voltage difference between the biases of the buried electrodes may be at least 0.5V, and a capacitance of one capacitor may be at least 1.2 times, such as 2.0 times the capacitance of another capacitor.

11 Claims, 4 Drawing Sheets

US 7,923,815 B2

DRAM HAVING DEEP TRENCH CAPACITORS WITH LIGHTLY DOPED BURIED PLATES

FIELD OF THE INVENTION

The invention relates to dynamic random access memory (DRAM) and, more particularly to embedded DRAM (eDRAM) and, more particularly to deep trench (DT) capacitors used in DRAM.

BACKGROUND OF THE INVENTION

The transistor is a solid state semiconductor device which can be used for amplification, switching, voltage stabilization, signal modulation and many other functions. Generally, a transistor has three terminals, and a voltage applied to a specific one of the terminals controls current flowing between the other two terminals. One type of transistor is known as the field effect transistor (FET).

The terminals of a field effect transistor (FET) are commonly named source, gate and drain. In the The transistor is a solid state semiconductor device which can be used for amplification, switching, voltage stabilization, signal modulation and many other functions. Generally, a transistor has three terminals, and a voltage applied to a specific one of the terminals controls current flowing between the other two terminals. One type of transistor is known as the field effect transistor (FET).The terminals of a field effect transistor (FET) are commonly named source, gate and drain. In the FET, a small amount of voltage is applied to the gate (G) in order to control current flowing between the source (S) and drain (D). In FETs, the main current appears in a narrow conducting channel formed near (usually primarily under) the gate. This channel connects electrons from the source terminal to the drain terminal. The channel conductivity can be altered by varying the voltage applied to the gate terminal or by enlarging or constricting the conducting channel and thereby controlling the current flowing between the source and the drain.

FIG. 1A illustrates a FET 100 comprising a p-type substrate (or a p-well in the substrate), and two spaced-apart n-type diffusion areas—one of which will serve as the "source", the other of which will serve as the "drain" of the transistor.

The space between the two diffusion areas is called the "channel". The channel is where current flows, between the source (S) and the drain (D). A schematic symbol for an n-channel MOSFET appears to the left of FIG. 1A.

A thin dielectric layer is disposed on the substrate above the channel, and a "gate" structure (G) is disposed over the dielectric layer, thus also atop the channel. (The dielectric under the gate is also commonly referred to as "gate oxide" or "gate dielectric".)

Electrical connections (not shown) may be made to the source (S), the drain (D), and the gate (G). The substrate may be grounded or biased at a desired voltage depending on applications.

Generally, when there is no voltage applied to the gate, there is no electrical conduction (connection) between the source and the drain. As voltage (of the correct polarity, plus or minus) is applied to the gate, there is a "field effect" in the channel between the source and the drain, and current can flow between the source and the drain. This current flowing in the channel can be controlled by the voltage applied to the gate. In this manner, a small signal (gate voltage) can control a relatively large signal (current flow between the source and the drain).

The FET 100 is exemplary of a MOSFET (metal oxide semiconductor FET) transistor. With the specified "n" and "p" types shown above, an "n-channel MOSFET" can be formed. With opposite polarities (swapping "p" for "n" in the diffusions, and "n" for "p" in the substrate or well), a p-channel FET can be formed. In CMOS (complementary metal oxide semiconductor), both n-channel and p-channel MOS transistors are used, often paired with one another.

While particular n- and p-type dopants are described herein according to NMOS technology, it is to be appreciated that one or more aspects of the present invention are equally applicable to forming a PMOS (generally, simply by reversing the n- and p-type dopants).

An integrated circuit (IC) device may comprise many millions of FETs on a single semiconductor "chip" (or "die"), measuring only a few centimeters on each side. Several chips may be formed simultaneously, on a single "wafer", using conventional semiconductor fabrication processes including deposition, doping, photolithography, and etching.

U.S. Pat. No. 3,387,286 (IBM; 1968) discloses field effect transistor memory. The memory is formed of an array of memory cells controlled for reading and writing by word lines and bit lines which are connected to the cells. Each cell is formed using a single FET and a single capacitor. The gate electrode of the FET is connected to the word line, the source terminal is connected to the bitline, and the drain terminal is connected to one of the (two) electrodes of the capacitor. The other electrode of the capacitor is connected to a reference potential. Information is stored by charging the capacitor through the transistor, and information is read out by discharging the capacitor through the transistor. During a "write" operation, the wordline which is connected to the gate of the transistor is energized to render the transistor conductive between source and drain. If a "zero" is to be stored, the bitline is not energized and the capacitor is not charged. If a "one" is to be stored, the bitline is energized and the capacitor is charged to substantially the potential (voltage) of the bitline signal. During "read" operations, only the wordline is energized and a signal is transmitted to the bit lie if a "one" has been stored previously (the capacitor is charged). Since the charge on the capacitor leaks off, it is necessary to periodically regenerate the information stored in the memory.

This "regeneration" is generally done by reading a cell before sufficient time has elapsed for the charge to leak off to a point where it is unreadable and, if the read indicates that the capacitor was charged, it is recharged. This "refresh" of the cell's contents may have to be done several times per second, depending on the cell's "retention time". The dynamic nature of maintaining data stored in the memory cells gives rise to the nomenclature "dynamic" random access memory, of DRAM.

Memory Array Architecture, Generally

Dynamic random access memory (DRAM) is a type of random access memory that usually stores data as electrical charges in a capacitor structure associated with a transistor. Since capacitors leak charge (generally, a capacitor is only useful for temporarily storing an electrical charge), the information (data) eventually fades unless the capacitor charge is refreshed (read, and re-written) periodically, such as every 64 ms (milliseconds). DRAM is usually arranged in an array of one capacitor and transistor per "cell".

Memory arrays are well known, and comprise a plurality (many, including many millions) of memory cells organized (including physically arranged) in rows (usually represented in drawings as going across the page, horizontally, from left-to-right) and columns (usually represented in drawings as going up and down the page, from top-to-bottom).

FIG. 1B illustrates an array of DRAM cells (labeled "a" through "i") connected to a number of word lines (WL) and bit lines (BL). (Each DRAM cell is shown as comprising a FET and a capacitor.) For example, in the memory cell "e", the FET has its gate connected to WL(n), its source is connected to BL(n), and its drain connected to one terminal of a capacitor. The other terminal of the capacitor is connected to ground. The nine memory cells ("a" through "i") illustrated in FIG. 1B are exemplary of many millions of memory cells that may be resident on a single chip.

The gates of the FETs in memory cells "a", "b" and "c" are all connected to the same word line WL(n−1), the gates of the FETs in memory cells "d", "e" and "f" are all connected to the same word line WL(n), and the gates of the FETs in memory cells "g", "h" and "i" are all connected to the same word line WL(n+1). Thus, a voltage applied to a given word line (WL) can affect many memory cells—namely all the memory cells connected to that word line.

Similarly, the sources of the FETs in memory cells "a", "d" and "g" are all connected to the same bit line BL(n−1), the sources of the FETs in memory cells "b", "e" and "h" are all connected to the same bit line BL(n), and the sources of the FETs in memory cells "c", "f" and "i" are all connected to the same bit line BL(n+1). Thus, a voltage applied to a given bit line (BL) can affect many memory cells—namely all the memory cells connected to that word line.

Generally, to perform a write operation on a given memory cell, the appropriate wordline and bitline are "activated". For example, to write a logic one in memory cell "e", a voltage of 2 volts may be placed on WL(n), and a voltage of 1.2 volts may be placed on BL(n).

DRAM Performance Issues

FIG. 1C illustrates, schematically, a DRAM cell, such as a single one of the DRAM cells described with respect to FIG. 1B, comprising a FET (M1), and a storage capacitor. One of the source/drain diffusions (typically the source) of M1 is connected to a bitline, the other of the diffusions is connected to the storage capacitor. The gate of M1 is connected to a wordline.

The storage capacitor has a capacitance "Cn". The bitline is a long conductor to which many DRAM cells may be connected. The bitline exhibits a capacitance "Cb1".

A transfer ratio "T" may be defined, for charging the capacitor, as follows:

$$T=Cn/(Cb1+Cn)$$

Generally, the idea is that when M1 is switched on, the bitline voltage (Vdd) can be "transferred" to the capacitor—to charge or discharge the capacitor. Generally, the two (binary) logic states for a DRAM are charged and not charged.

If the bitline capacitance Cb1 were very small, such as zero, the transfer ratio T would be one, since Cn/(Cb1+Cn) would be Cn/(0+Cn) which would be Cn/Cn=1.

If the bitline capacitance is large, the transfer ratio would be small. For example, if Cb1 were ~10 times Cn, then the transfer ratio would be Cn/((~10*Cn)+Cn)=Cn/(~11*Cn)~= 10%.

Historically, Cb1 is much larger than Cn, so the transfer ratio is typically very small.

For high performance DRAM (including eDRAM), it is known to use short bitlines, thereby decreasing the bitline capacitance Cb1 and improving the transfer ratio. However, by using many short bitlines instead of fewer longer bitlines, density (the number of devices which can be implemented in a given area) suffers.

Increasing the capacitance Cn of the storage capacitor is another way of improving transfer ratio, but this has its limitations too.

On the other hand, a smaller Cn can enable faster write of Vdd. This is due to the inherent "RC" time constant which is involved when charging a capacitor. Generally, the time required to charge a capacitor is related to the product of resistance "R" (which is desirably kept very low) times the capacitance "C". Thus, the lower the capacitance, A line coming down from the middle of M1 represents the "body" potential for the FET. This is what can be considered to be the "starting" voltage at the channel, which will work either "with" or "against" a voltage applied to the gate of the FET. Usually the body is grounded (zero volts). In some applications, a non-zero voltage may be applied to the body. Generally, with a body voltage of zero, the DRAM cell may have high performance, but may be leakier (less ability to retain the charge on the storage capacitor). On the other hand, the body voltage may be set to increase retention of charge on the storage capacitor, but generally only at the expense of reduced performance.

These (transfer ratio, performance, retention) are some of the issued related to DRAM and, as can be seen, there are numerous tradeoffs involved.

There are many applications for DRAM, with different requirements. It is not simply a matter of one DRAM being "better" than the other. Since there are always tradeoffs involved (such as performance versus retention), some applications can benefit from DRAM having higher performance with lower retention, and other applications can benefit from DRAM having higher retention with lower performance.

For example, there are different "levels" of cache memory (or simply "cache"). Cache memory is generally a temporary memory inserted between (for example) a very fast microprocessor with very little storage capability, and a mass storage device such as a hard disk which has very large storage capability but is very slow. In order to move data between these two entities (microprocessor and hard disk), cache memory can be inserted to temporarily store the data while, for example, the hard drive has time to write the data being sent to it by the microprocessor, freeing up the microprocessor for subsequent tasks. Generally, for example, some cache may be incorporated into the microprocessor, some may be external to the microprocessor, some cache may be on the motherboard, a hard disk may have its own cache associated therewith (clearly, external to the microprocessor), etc. And, data may pass through many levels of cache.

Physical Structure of DRAM cells

Generally, the DRAM cells discussed herein comprise a capacitor formed in a deep trench (DT) in a substrate, and an "access transistor" formed on the surface of the substrate adjacent and atop the capacitor. The capacitor ("DT capacitor") generally comprises a first conductive region called the "buried plate" (or "counterelectrode") which is a heavily doped region of the substrate surrounding the trench, a thin layer of insulating material such as oxide lining the trench, and a second conductive entity such as a heavily doped polycrystalline plug (or "node") disposed within the trench. The transistor may comprise a FET having its drain (D) terminal connected to (or an extension of) the second electrode of the capacitor.

Regarding forming the buried plate of the DT capacitor, various techniques are known. For example, when forming a buried plate in a silicon trench, a layer of arsenic doped silicate glass ("ASG") is disposed over a lower portion of the sidewalls of the trench using a Low Pressure Chemical Vapor Deposition (LPCVD) technique. The arsenic doped glass layer, when annealed, results in the diffusion of the arsenic into the silicon trench. In order to avoid increasing parasitic leakage currents along side walls of the trench, diffusion of the arsenic may be restricted to the lower portion of the trench, thereby avoiding diffusion of arsenic into the whole of the side walls of the silicon trench. It is therefore known to deposit an undoped glass layer over the trench using any suitable technique such as Chemical Vapor Deposition (CVD) technique. The undoped glass layer completely covers the side walls and the arsenic doped silicate glass layer in order to prevent arsenic escaping into the trench and causing an electrical connection which could short-circuit subsequently deposited electrodes. Separate stand-alone pieces of semiconductor processing equipment, sometimes known as tools or chambers, are used to deposit layers using the above-mentioned LPCVD and CVD techniques, respectively. See U.S. Pat. No. 6,316,310 (Siemens; 2001), incorporated by reference herein. Other techniques for forming a buried plate may include ion implantation, plasma doping, gas phase doping, solid phase doping, liquid phase doping.

FIG. 2 illustrates a DRAM cell 200 of the prior art, generally comprising an access transistor and an associated cell capacitor. Also shown is a wordline (WL), or "pass gate", passing over the DT capacitor. The DRAM cell is generally formed, as follows.

Beginning with a semiconductor substrate 202, a deep trench (DT) 210 is formed, extending into the substrate 202, from a top (as viewed) surface thereof. The substrate 202 may comprise a SOI substrate having a layer 204 of silicon (SOI) on top of an insulating layer 206 which is atop an underlying silicon substrate 208. The insulating layer 206 typically comprises buried oxide (BOX). The deep trench (DT) 210 is for forming the cell capacitor (or "DT capacitor"), as follows. The trench 210 may have a width of about 50 nm to 200 nm and a depth of 1000 nm to 10000 nm, by way of example.

The cell capacitor generally comprises a first conductor called the "buried plate" which is a heavily doped region 212 of the substrate surrounding the trench 210, a thin layer 214 of insulating material lining the trench 210, and a second conductor 216 such as a heavily doped polycrystalline plug (or "node", "DT poly") disposed within the trench 210. A cell transistor ("access transistor") 220 may comprise a FET having one of its source/drain (S/D) terminals connected to (or an extension of) the second conductor (node) of the capacitor, as follows.

The FET 220 comprises two spaced-apart diffusions, 222 and 224, within the surface of the substrate 202—one of which will serve as the "source" and the other of which will serve as the "drain" (D) of the transistor 220. The space between the two diffusion areas is called the "channel" (and is approximately where the legend "SOI" appears). A thin dielectric layer 226 is disposed on the substrate above the channel, and a "gate" structure (G) 228 is disposed over the dielectric layer 226, thus also atop the channel. (The dielectric under the gate is also commonly referred to as "gate oxide" or "gate dielectric".) The gate 228 may be a portion of an elongate wordline, referred to (for this memory cell) as the "active wordline" (Active WL).

Generally, a plurality of DRAM/eDRAM memory cells in a given row of a memory array may utilize a given wordline as the gates for their access transistors. And the source diffusions of the DRAM/eDRAM memory cells in a given column of a memory array may utilize a given bitline as the sources (S) for their access transistors.

In modern CMOS technology, shallow trench isolation (STI) is commonly used to isolate one (or more) transistors from other transistors, for both logic and memory. As shown in FIG. 2, a shallow trench 232 may be formed, surrounding the access transistor 220 (only one side of the transistor is shown). Note that the trench 232 extends over the DT (node) poly 216, a top portion of which is adjacent the drain (D) of the transistor 220. Therefore, the trench 232 is less deep (thinner) over the DT poly 216 and immediately adjacent the drain (D) of the transistor 220, and may be deeper (thicker) further from the drain (D) of the transistor 220 (and, as shown, over top portion of the DT poly 216 which is distal from (not immediately adjacent to) the drain (D) of the transistor 220.

The STI trench 232 may be filled with an insulating material, such as oxide (STI oxide) 234. Because of the thin/thick trench geometry which has been described, the STI oxide will exhibit a thin portion 234a where it is proximal (adjacent to) the drain (D) of the transistor 220, and a thicker portion where it is distal from (not immediately adjacent to) the drain (D) of the transistor 220.

As mentioned above, a plurality of memory cells may be associated with a given word line (WL). Furthermore, the wordline may form the gates of the access transistors of those memory cells. In this example, the transistor 220 of the memory cell 200 is associated with the "active" wordline, which forms its gate (G). Another wordline, for another plurality of memory cells is shown, and is labeled "Pass WL" 240. And, as can be seen, the Pass WL 240 passes over the STI 234, above the node poly 216.

U.S. Pat. No. 4,688,063 (IBM, 1987), incorporated by reference herein, discloses dynamic ram cell with MOS trench capacitor in CMOS. This patent relates generally to Dynamic Random Access Memory (DRAM) cells and more particularly relates to a DRAM cell wherein the storage capacitor of the cell is disposed in a trench formed in a semiconductor substrate. Still more particularly, it relates to a DRAM cell wherein at least a portion of the substrate is heavily doped and forms the counterelectrode of the storage capacitor while a heavily doped polycrystalline plug disposed in the trench capacitor forms the other electrode of the storage capacitor. The DRAM cell includes a field effect access transistor disposed in a well which is opposite in conductivity type to that of the substrate. The well itself is formed in a lightly doped portion of the substrate and may be n or p-type conductivity with the other portions of the cell having conductivity types appropriate for devices fabricated in the CMOS environment. The trench capacitor extends from the surface of the well through the well and lightly doped substrate portion into the heavily doped portion of the substrate. The electrode disposed in the trench is directly connected to the source/drain of the access transistor.

US Patent Publication 20050280063 (IBM, 2005) discloses microelectronic element having trench capacitors with different capacitance values. A microelectronic element is provided having a major surface, the microelectronic element including a first capacitor formed on a sidewall of a first trench, the first trench being elongated in a downwardly extending direction from the major surface. The microelectronic element further includes a second capacitor formed on a sidewall of a second trench, the second trench being elongated in a downwardly extending direction from the major surface, wherein a top of the first capacitor is disposed at a first depth from the major surface, and a top of the second capacitor is disposed at a second depth from the major surface. As noted therein:

> The present invention relates to microelectronic devices and processing, and more particularly to a microelectronic element and method for forming trench capacitors having different capacitance values on the same microelectronic element.

As the speed and circuit density of integrated circuits ("ICs" or "chips") is increased from one generation to the next, a greater need exists for capacitive elements that are located close to logic circuits of a chip, or as parts of internal power supply circuits, for example. Thus, capacitive elements must often be provided on the same integrated circuit as such logic circuits and power supply circuits. Trench capacitors are used for storing data bits in some types of dynamic random access memories (DRAMs) and embedded DRAM (eDRAM) macros of chips that contain other functional elements such as processors. In such chips, the use of trench capacitors is favored for other purposes, e.g., to support logic circuits, and as parts of internal power supply circuits, because such other purpose trench capacitors can be formed at the same time as the trench capacitors of the DRAM or eDRAM. When a fairly large amount of capacitance is needed on a chip for such other purpose, a large number of trench capacitors are usually wired together, all having first plates held at a fixed potential such as ground and second plates wired together on which the potential is allowed to vary during operation or remains at a constant potential during operation. In such circumstances, significant usable area of an integrated circuit is occupied by an array of trench capacitors that are wired together of such purpose. Accordingly, the size of such array of trench capacitors is desirably made small, in order not to take up too much of the area of the integrated circuit.

One way of decreasing the size of such capacitor arrays is to enlarge the lateral, i.e. horizontal, dimensions of individual trench capacitors of the array, such as described in U.S. Pat. No. 6,566,191. For example, if the lateral dimension of the trench capacitor of a DRAM array is 90 nm in one lateral direction, the lateral dimension of a trench capacitor used for the different purpose, e.g., to support logic circuits, could be 135 nm, for example. However, the etching of trenches to different lateral dimensions is difficult. Reactive ion etching (RIE) of a hard mask layer and RIE of the underlying semiconductor substrate are difficult to adequately control when trenches having such different dimensions. In particular, the silicon profile control is difficult to maintain during an etching process for simultaneously etching trenches having two different lateral dimensions.

It would be desirable to provide a process of forming trench capacitors in which the lateral dimensions of the trench capacitors are substantially the same, such that the foregoing difficulties in etching are avoided.

Glossary

Unless otherwise noted, or as may be evident from the context of their usage, any terms, abbreviations, acronyms or scientific symbols and notations used herein are to be given their ordinary meaning in the technical discipline to which the invention most nearly pertains. The following terms, abbreviations and acronyms may be used throughout the descriptions presented herein and should generally be given the following meaning unless contradicted or elaborated upon by other descriptions set forth herein. Some of the terms set forth below may be registered trademarks (®).

Accumulation, depletion and inversion modes These are modes of operating a FET. The accumulation mode occurs when the bias voltage, Vgs, is substantially less than the inherent threshold voltage, Vt, of the transistor. The threshold voltage, Vt, is the voltage at which a MOS begins to conduct. The depletion mode occurs when the bias voltage, Vgs, is substantially near the inherent threshold voltage, Vt, of the transistor. Therefore, the accumulation and depletion modes are inactive modes in which the transistor is deactivated, that is, not actively conducting current. In contrast, inversion mode is an active mode since the transistor is actively conducting current. One advantage of operating a transistor in the accumulation and depletion modes, rather than inversion mode, is minimizing the gate to substrate leakage since the leakage is proportional to Vgs. Therefore, due to the lower gate to substrate leakage, one can aggressively increase the memory density and reduce refresh time in a particular application. See U.S. Pat. No. 6,359,802, (Intel; 2002) incorporated by reference herein.

ASIC short for application-specific integrated circuit. An ASIC is an integrated circuit (IC) customized for a particular use, rather than intended for general-purpose use. For example, a chip designed solely to run a cell phone is an ASIC. In contrast, the 7400 series and 4000 series integrated circuits are logic building blocks that can be wired together for use in many different applications. Intermediate between ASICs and standard products are application specific standard products (ASSPs).

bit The word "bit" is a shortening of the words "binary digit." A bit refers to a digit in the binary numeral system (base 2). A given bit is either a binary "1" or "0". For example, the number 1001011 is 7 bits long. The unit is sometimes abbreviated to "b". Terms for large quantities of bits can be formed using the standard range of prefixes, such as kilobit (Kbit), megabit (Mbit) and gigabit (Gbit). A typical unit of 8 bits is called a Byte.

BL short for bit line. The bit line is a conductor connected to at least one of the source or drain terminals of a memory cell transistor. In DRAM, the bitline is typically connected to the source of the transistor, and the drain is connected to one of the electrodes of the memory cell capacitor.

cache In computer science, a cache is a collection of data duplicating original values stored elsewhere or computed earlier, where the original data is expensive to fetch (due to longer access time) or to compute, compared to the cost of reading the cache. In other words, a cache is a temporary storage area where frequently accessed data can be stored for rapid access. Once the data is stored in the cache, future use can be made by accessing the cached copy rather than re-fetching or recomputing the original data, so that the average access time is shorter. Cache, therefore, helps expedite data access that the CPU would otherwise need to fetch from main memory. Some common forms of cache are L1, L2 and L3 cache.

L1 cache: short for Level 1 cache. L1 cache is a memory cache built into the microprocessor.

L2 cache: short for Level 2 cache. L2 cache memory is external to the microprocessor. In general, L2 cache memory, also called the secondary cache, resides on a separate chip from the microprocessor chip. Although, more and more microprocessors are including L2 caches into their architectures.

L3 cache: short for Level 3 cache. As more and more processors begin to include L2 cache into their architectures, Level 3 cache is now the name for the extra cache built into motherboards between the microprocessor and the main memory. Quite simply, what was once L2 cache on motherboards now becomes L3 cache when used with microprocessors containing built-in L2 caches.

capacitor A capacitor is an electrical/electronic device that can store energy in the electric field between a pair of conductive electrodes (called "plates"). The process of storing energy in the capacitor is known as "charging", and involves electric charges of equal magnitude, but opposite polarity, building up on each plate.

Cell Well (CW) the cell well is an area in the silicon substrate that is prepared for functioning as a transistor or memory cell device by doping with an electron acceptor material such as boron or indium (p, electron acceptors or holes) or with an electron donor material such as phosphorous or arsenic (n, electron donors). The depth of a cell well is defined by the depth of the dopant distribution.

CMOS short for complementary metal oxide semiconductor. CMOS consists of n-channel and p-channel MOS transistors. Due to very low power consumption and dissipation as well as minimization of the current in "off" state, CMOS is a very effective device configuration for implementation of digital functions. CMOS is a key device in state-of-the-art silicon microelectronics.CMOS Inverter: A pair of two complementary transistors (a p-channel and an n-channel) with the source of the n-channel transistor connected to the drain of the p-channel transistor, and the gates connected to each other. The output (drain of the p-channel transistor) is high whenever the input (gate) is low and the other way round. The CMOS inverter is the basic building block of CMOS digital circuits.

NMOS: n-channel CMOS.

PMOS: p-channel CMOS.

CVD short for chemical vapor deposition. CVD is a chemical process used to produce high-purity, high-performance solid materials. The process is often used in the semiconductor industry to produce thin films. In a typical CVD process, the wafer (substrate) is exposed to one or more volatile precursors, which react and/or decompose on the substrate surface to produce the desired deposit. CVD is used to deposit materials in various forms, including: monocrystalline, polycrystalline, amorphous, and epitaxial. These materials include: silicon, oxide, nitride and metals, such as are commonly used in semiconductor fabrication.

deposition Deposition generally refers to the process of applying a material over another material (or the substrate). Chemical vapor deposition (CVD) is a common technique for depositing materials. Other "deposition" techniques, such as for applying resist or glass, may include "spin-on", which generally involves providing a stream of material to the substrate, while the substrate is spinning, resulting in a relatively thin, flat, evenly-distributed coating of the material on the underlying substrate.

dopant element introduced into semiconductor to establish either p-type (acceptors) or n-type (donors) conductivity; common dopants in silicon: p-type, boron (B), Indium (In); n-type phosphorous (P), arsenic (As), antimony (Sb). Dopants are of two types—"donors" and "acceptors". N type implants are donors and P type are acceptors.

doping doping is the process of introducing impurities (dopants) into the semiconductor substrate, or elements formed on the semiconductor substrate, and is often performed with a mask (or previously-formed elements in place) so that only certain areas of the substrate will be doped. For example, doping is used to form the source and drain regions of an FET. An ion implanter is typically employed for the actual implantation. An inert carrier gas such as nitrogen is usually used to bring in the impurity source (dopant).

Usually in doping, a dopant, a dosage and an energy level are specified and/or a resulting doping level may be specified. A dosage may be specified in the number of atoms per $cm^2$ and an energy level (specified in keV, kilo-electron-volts), resulting in a doping level (concentration in the substrate) of a number of atoms per $cm^3$. The number of atoms is commonly specified in exponential notation, where a number like "3E15" means 3 times 10 to the 15th power, or a "3" followed by 15 zeroes (3,000,000,000,000,000). To put things in perspective, there are about 1E23 (100,000,000,000,000,000,000,000) atoms of hydrogen and oxygen in a cubic centimeter (cm3) of water.

An example of doping is implanting with B (boron) with a dosage of between about 1E17 and 1E18 atoms/cm2, and an energy of about 40 to 80 keV to produce a doping level of between 1E20 and 1E21 atoms/$cm^3$. ("/$cm^3$" may also be written "$cm^{-3}$", both meaning "per cubic centimeter")

DRAM short for dynamic random access memory. DRAM is a type of random access memory that stores each bit of data in a separate capacitor within an integrated circuit. Since real capacitors leak charge, the information eventually fades unless the capacitor charge is refreshed periodically. Because of this refresh requirement, it is a dynamic memory as opposed to SRAM and other static memory. Its advantage over SRAM is its structural simplicity: only one transistor and a capacitor are required per bit, compared to six transistors in SRAM. This allows DRAM to reach very high density. Like SRAM, it is in the class of volatile memory devices, since it loses its data when the power supply is removed.

eDRAM short for embedded DRAM. EDRAM is a capacitor-based dynamic random access memory usually integrated on the same die or in the same package as the main ASIC or processor, as opposed to external DRAM modules and transistor-based SRAM typically used for caches.

etching etching generally refers to the removal of material from a substrate (or structures formed on the substrate), and is often performed with a mask in place so that material may selectively be removed from certain areas of the substrate, while leaving the material unaffected, in other areas of the substrate. There are generally two categories of etching, (i) wet etch and (ii) dry etch.

Wet etch is performed with a solvent (such as an acid) which may be chosen for its ability to selectively dissolve a given material (such as oxide), while leaving another material (such as polysilicon) relatively intact. This ability to selectively etch given materials is fundamental to many semiconductor fabrication processes. A wet etch will generally etch a homogeneous material (e.g., oxide) isotropically, but a wet etch may also etch single-crystal materials (e.g. silicon wafers) anisotropically.

Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotropic. Ion milling, or sputter etching, bombards the wafer with energetic ions of noble gases which approach the wafer approximately from one direction, and therefore this process is highly anisotropic. Reactive-ion etching (RIE) operates under conditions intermediate between sputter and plasma etching and may be used to produce deep, narrow features, such as STI trenches.

FET short for field effect transistor. The FET is a transistor that relies on an electric field to control the shape and hence the conductivity of a "channel" in a semiconductor material. FETs are sometimes used as voltage-controlled resistors. The terminals of FETs are designated source (S), drain (D) and gate (G).

flat band condition in metal oxide semiconductor microelectronics, "flat band condition" is defined as the point at which an external applied voltage causes no internal potential difference across a metal oxide semiconductor structure.

isotropic literally, identical in all directions. An example of an isotropic process is dissolving a tablet in water. All exposed surfaces of the tablet are uniformly acted upon. (see "anisotropic")

KeV the symbol "eV" is a unit of energy. 1 eV is the amount of energy equivalent to that gained by a single unbound electron when it is accelerated through an electrostatic potential difference of one volt, in a vacuum. In other words, it is equal to one volt (1 volt=1 joule per coulomb) times the (unsigned) charge of a single electron. "keV" is short for kilo-electron volts, or 1000 electron volts.

latency in engineering terms, "latency" may refer to a time delay between the moment something is initiated and the moment its first effect begins, or can begin. As applicable to DRAM, latency is a parameter used to measure an amount of time required to access a number of DRAM cells, a byte, or word after the appropriate address is asserted. See U.S. Pat. No. 5,856,940 (Siemens; 1999), incorporated by reference herein.

lithography In lithography (or "photolithography"), a radiation sensitive "resist" coating is formed over one or more layers which are to be treated in some manner, such as to be selectively doped and/or to have a pattern transferred thereto. The resist, which is sometimes referred to as a photoresist, is itself first patterned by exposing it to radiation, where the radiation (selectively) passes through an intervening mask or template containing the pattern. As a result, the exposed or unexposed areas of the resist coating become more or less soluble, depending on the type of photoresist used. A developer is then used to remove the more soluble areas of the resist leaving a patterned resist. The pattered resist can then serve as a mask for the underlying layers which can then be selectively treated, such as to receive dopants and/or to undergo etching, for example.

mask The term "mask" may be given to a layer of material which is applied over an underlying layer of material, and patterned to have openings, so that the underlying layer can be processed where there are openings. After processing the underlying layer, the mask may be removed. Common masking materials are photoresist (resist) and nitride. Nitride is usually considered to be a "hard mask".

MOS short for metal oxide semiconductor.

MOSFET short for metal oxide semiconductor field-effect transistor. MOSFET is by far the most common field-effect transistor in both digital and analog circuits. The MOSFET is composed of a channel of n-type or p-type semiconductor material, and is accordingly called an NMOSFET or a PMOSFET. (The 'metal' in the name is an anachronism from early chips where gates were metal; modern chips use polysilicon gates, but are still called MOSFETs).

nitride commonly used to refer to silicon nitride (chemical formula Si3N4). A dielectric material commonly used in integrated circuit manufacturing. Forms an excellent mask (barrier) against oxidation of silicon (Si). Nitride is commonly used as a hard mask (HM).

n-type semiconductor in which concentration of electrons is higher than the concentration of "holes". See p-type.

oxide commonly used to refer to silicon dioxide (SiO2). Also known as silica. SiO2 is the most common insulator in semiconductor device technology, particularly in silicon MOS/CMOS where it is used as a gate dielectric (gate oxide); high quality films are obtained by thermal oxidation of silicon. Thermal SiO2 forms a smooth, low-defect interface with Si, and can be also readily deposited by CVD. Oxide may also be used to fill STI trenches, form spacer structures, and as an inter-level dielectric, for example.

poly short for polycrystalline silicon (Si). Heavily doped poly Si is commonly used as a gate contact in silicon MOS and CMOS devices;

p-type semiconductor in which concentration of "holes" is higher than the concentration of electrons. See n-type. Examples of p-type silicon include silicon doped (enhanced) with boron (B), Indium (In) and the like.

RAM short for random access memory. RAM is a type of computer data storage. It takes the form of integrated circuits that allow the stored data to be accessed in any order—that is, at random and without the physical movement of the storage medium or a physical reading head. RAM is a volatile memory as the information or instructions stored in it will be lost if the power is switched off.

resist short for photoresist. also abbreviated "PR". Photoresist is often used as a masking material in photolithographic processes to reproduce either a positive or a negative image on a structure, prior to etching (removal of material which is not masked). PR is usually washed off after having served its purpose as a masking material.

RIE short for reactive ion etching. RIE is an etching technology used in microfabrication. It uses chemically reactive plasma to remove material deposited on wafers. The plasma is generated under low pressure (vacuum) by an electromagnetic field. High-energy ions from the plasma attack the wafer surface and react with it.

Si Silicon, a semiconductor.

SOI short for silicon-on-insulator. Silicon on insulator (SOI) technology refers to the use of a layered silicon-insulator-silicon substrate in place of a conventional silicon substrate in semiconductor manufacturing, especially microelectronics. SOI-based devices differ from conventional silicon-built devices in that the silicon junction is above an electrical insulator, typically silicon dioxide or (less commonly) sapphire.

SRAM short for static random access memory. SRAM is a type of semiconductor memory. The word "static" indicates that the memory retains its contents as long as power remains applied, unlike dynamic RAM (DRAM) that needs to be periodically refreshed (nevertheless, SRAM should not be confused with read-only memory and flash memory, since it is volatile memory and preserves data only while power is continuously applied). SRAM should not be confused with SDRAM, which stands for synchronous DRAM and is entirely different from SRAM, or with pseudostatic RAM (PSRAM), which is DRAM configured to function, to an extent, as SRAM.

STI short for shallow trench isolation. Generally, a trench etched into the substrate and filled with an insulating material such as oxide, to isolate one region of the substrate from an adjacent region of the substrate.

Substrate typically a wafer, of semiconductor material such as silicon, germanium, silicon germanium, silicon carbide, and those consisting essentially of III-V compound semiconductors such as GaAs, II-VI compound semiconductors such as ZnSe. A substrate may also comprise an organic semiconductor or a layered semiconductor such as, for example, Si/SiGe, a silicon-on-insulator or a SiGe-on-insulator. A portion or entire semiconductor substrate may be amorphous, polycrystalline, or monocrystalline. In addition to the aforementioned types of semiconductor substrates, the semiconductor substrate employed in the present invention may also comprise a hybrid oriented (HOT) semiconductor substrate in which the HOT substrate has surface regions of different crystallographic orientation. The semiconductor substrate may be doped, undoped or contain doped regions and undoped regions therein. The semiconductor substrate may contain regions with or without strain therein, or contain regions of tensile strain and compressive strain. A substrate is often covered by an oxide layer (sometimes referred to as a "pad oxide layer"). Pad oxide is usually relatively thin, e.g., in the range of about 50 to about 500 Angstroms (5-50 nm), and can be formed, for example, by thermal oxidation of the substrate. Pad oxide may also be prepared by other methods. For example, silicon dioxide or reactive precursors like silane could be deposited by chemical vapor deposition (CVD). A nitride layer (sometimes referred to as a "pad nitride layer") may be formed to protect the pad oxide and the underlying substrate during various processing steps. It usually has a thickness in the range of about 100 Angstroms to about 6000 Angstroms (10-600 nm), such as in the range of about 1500 Angstroms to about 3000 Angstroms (150-300 nm). Conventional means can be used to apply the pad nitride, such as chemical vapor deposition (CVD).

Units of Length Various units of length may be used herein, as follows:

meter (m) A meter is the SI unit of length, slightly longer than a yard.

1 meter=~39 inches. 1 kilometer (km)=1000 meters=~0.6 miles.

1,000,000 microns=1 meter. 1,000 millimeters (mm)=1 meter.

100 centimeters (cm)=1 meter.

micron (μm) one millionth of a meter (0.000001 meter); also referred to as a micrometer.

mil ¹⁄₁₀₀₀ or 0.001 of an inch; 1 mil=25.4 microns.

nanometer (nm) one billionth of a meter (0.000000001 meter).

Angstrom (Å) one tenth of a billionth of a meter. 10 Å=1 nm.

V short for voltage. Different voltages may be applied to different parts of a transistor or memory cell to control its operation, such as:

Vb short for bulk (or substrate) voltage

Vd short for drain voltage

Vg short for gate voltage

Vn short for node voltage

Vpl short for plate voltage Vs short for source voltage

Vt short for threshold voltage

See also KeV wafer In microelectronics, a wafer is a thin slice of semiconductor material, such as a silicon crystal, upon which microcircuits are constructed. There are multiple orientation planes in the silicon crystal that can be used. The planes are defined by the "Miller Indices" methodology. Common orientations classified by the "Miller indices" are (100), (011), (110), and (111).

SUMMARY OF THE INVENTION

It is a general object of the invention to provide an improved technique for implementing eDRAM.

It is a further object to provide a technique for fabricating capacitors for eDRAM having different capacitance values while maintaining substantially the same physical dimensions as one another.

The "one-size-fits-all era" of eDRAM is over. For different applications, different DRAM designs are needed to optimize performance, power consumption or packing density. There clearly are many cases where these different design needs need to be integrated on the same chip. For example, (i) a conventional eDRAM with 128 ms retention which requires larger DT capacitance than that required by a high performance eDRAM macro that is developed on the same test site. The current process is we either get the optimized capacitance for the conventional macro or the optimized capacitance for the high performance macro—we cannot get both without significantly complicating the process. Another example is the increasing bits and areas of L2 and L3 cache calling for the on-chip integration of eDRAM to replace bulky SRAM which is also suffering from escalated soft error rate (SER). As high performance eDRAM macros are developed, a need will arise to use high performance eDRAM as L2 cache and conventional/more dense eDRAMs as L3 cache. In short, the ability to create different DT capacitors on the same chip at low cost can significantly reduce development cost and in the future offer attractive alternatives to SRAM cache on microprocessors.

In the aforementioned US2005/0280063, capacitance is controlled by trench depth (recessing the poly in the trench). This requires additional masks and at least two additional DT etch steps, which is a significant cost adder. The present invention strives to provide a solution at zero added cost.

According to the invention, generally, by carefully controlling plate doping level and plate bias condition, different DT capacitances can be obtained on the same chip with the same layout and DT process. Two immediate advantages are (1) two designs with different DT capacitance requirement can be merged on the same test site and run an identical DT process; (2) a high performance high retention eDRAM macro can be integrated on the same chip as level 2 and level 3 caches, respectively.

According to an embodiment of the invention, a microelectronic element comprises: a semiconductor substrate; a first capacitor comprising two electrodes and a dielectric layer sandwiched between the two electrodes; and a second capacitor comprising two electrodes and a dielectric layer sandwiched between the two electrodes; wherein: one of the two electrodes of each capacitor is a buried electrode disposed in the substrate; and the buried electrodes of the first capacitor and the second capacitor are biased at different voltages. The first and second capacitors may be trench capacitors. The first and second capacitors may be storage capacitors of DRAM/eDRAM cells.

According to an embodiment of the invention, a method of obtaining different capacitance values for a first and a second capacitor formed in a substrate and having substantially identical physical characteristics as one another, comprises forming the capacitors such that they exhibit substantial differences in capacitance when biased differently.

According to a feature of the invention, the buried electrodes are each located in a doped region of the substrate having a doping concentration; and the doping concentration is less than 3E19cm−3, such as less than 1E19cm−3, such as between 1E13 and 1E19cm−3, such as between 1E17 and 1E19cm−3.

According to a feature of the invention, a voltage difference between the biases of the buried electrodes of the first capacitor and the second capacitor is at least 0.5V, such as at least 1.0 volt.

According to a feature of the invention, the two capacitors have substantially different capacitances, such as the capacitance of the first capacitor at least 1.2 times the capacitance of the second capacitor, such as the capacitance of the first capacitor at least 2.0 times the capacitance of the second capacitor.

According to an embodiment of the invention, a design structure embodied in a machine readable medium for designing, manufacturing, or testing a design, the design structure comprises: a semiconductor substrate; a first capacitor comprising two electrodes and a dielectric layer sandwiched between the two electrodes; and a second capacitor comprising two electrodes and a dielectric layer sandwiched between the two electrodes; wherein: one of the two electrodes of each capacitor is a buried electrode disposed in the substrate; and the buried electrodes of the first capacitor and the second capacitor are biased at different voltages. The design structure may comprise a netlist, which describes the design. The design structure may reside on storage medium as a data format used for the exchange of layout data of integrated circuits. The design structure may include at least one of test data files, characterization data, verification data, and design specifications.

Other objects, features and advantages of the invention may become apparent in light of the following description thereof.

BRIEF DESCRIPTION OF THE DRAWINGS

The structure, operation, and advantages of the present invention will become further apparent upon consideration of the following description taken in conjunction with the accompanying figures (FIGS.). The figures are intended to be illustrative, not limiting. Certain elements in some of the figures may be omitted, or illustrated not-to-scale, for illustrative clarity. The cross-sectional views may be in the form of "slices", or "near-sighted" cross-sectional views, omitting certain background lines which would otherwise be visible in a "true" cross-sectional view, for illustrative clarity.

If shading or cross-hatching is used, it is intended to be of use in distinguishing one element from another (such as a cross-hatched element from a neighboring un-shaded element. It should be understood that it is not intended to limit the disclosure due to shading or cross-hatching in the drawing figures.

Figure 1A:
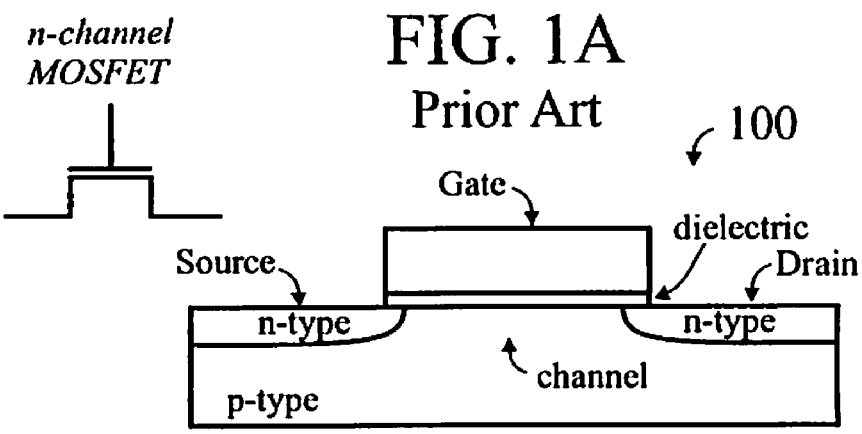

Elements of the figures may (or may not) be numbered as follows. The most significant digits (hundreds) of the reference number correspond to the figure number. For example, elements of FIG. 1 are typically numbered in the range of 100-199, and elements of FIG. 2 are typically numbered in the range of 200-299. Similar elements throughout the figures may be referred to by similar reference numerals. For example, the element 199 in FIG. 1 may be similar (and possibly identical) to the element 299 in FIG. 2. Throughout the figures, each of a plurality of elements 199 may be referred to individually as 199*a*, 199*b*, 199*c*, etc. Such relationships, if any, between similar elements in the same or different figures will become apparent throughout the specification, including, if applicable, in the claims and abstract.

Conventional electronic components may be labeled with conventional schematic-style references comprising a letter (such as A, C, Q, R) indicating the type of electronic component (such as amplifier, capacitor, transistor, resistor, respectively) followed by a number indicating the iteration of that element (such as "1" meaning a first of typically several of a given type of electronic component). Components such as resistors and capacitors typically have two terminals, which may be referred to herein as "ends". In some instances, "signals" are referred to, and reference numerals may point to lines that carry said signals. In the schematic diagrams, the various electronic components are connected to one another, as shown. Usually, lines in a schematic diagram which cross over one another and there is a dot at the intersection of the two lines are connected with one another; else (if there is no dot at the intersection) they are typically not connected with one another.

In the drawings accompanying the description that follows, both reference numerals and legends (labels, text descriptions) may be used to identify elements. If legends are provided, they are intended merely as an aid to the reader, and should not in any way be interpreted as limiting.

Figure 2:
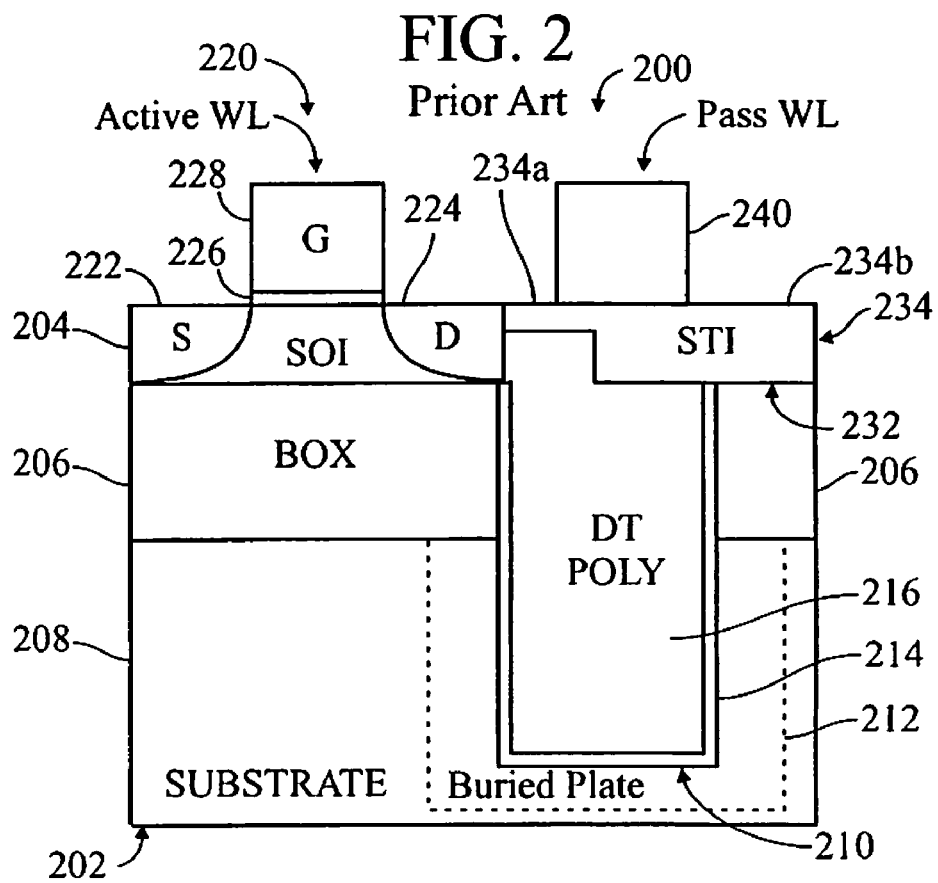

FIG. 1A is a cross-sectional view of a FET, according to the prior art.

Figure 1B:
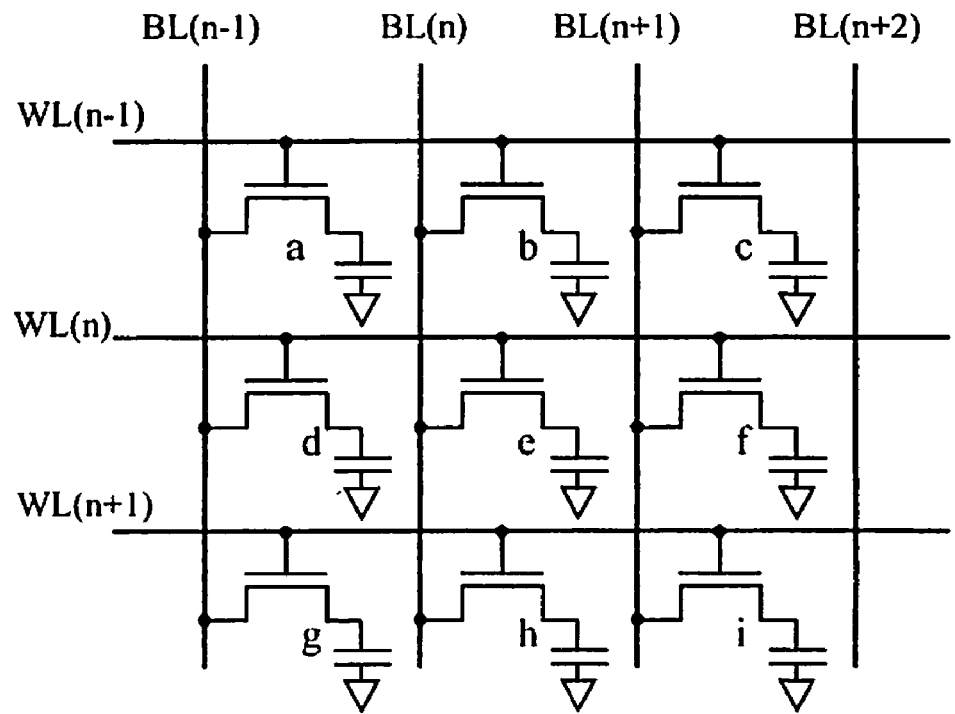

FIG. 1B is a diagram of an array of DRAM cells, according to the prior art.

Figure 1C:
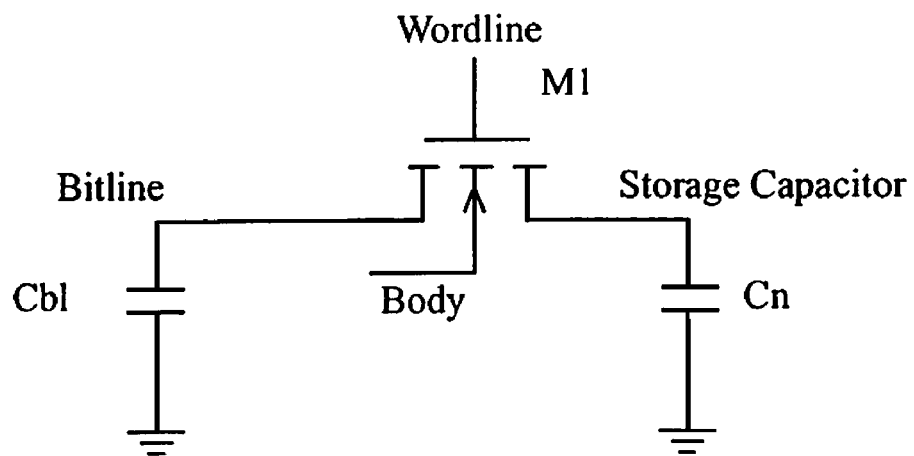

FIG. 1C is a diagram of single DRAM cell, showing capacitances, according to the prior art.

FIG. 2 is a cross-sectional view of a DRAM cell, according to the prior art.

Figure 3:
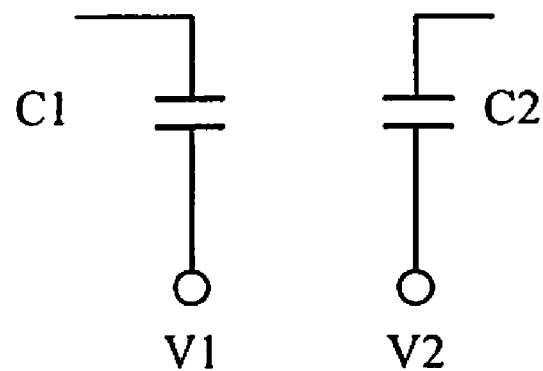

FIG. 3 is a schematic illustration of two capacitors, according to an embodiment of the invention.

Figure 4:
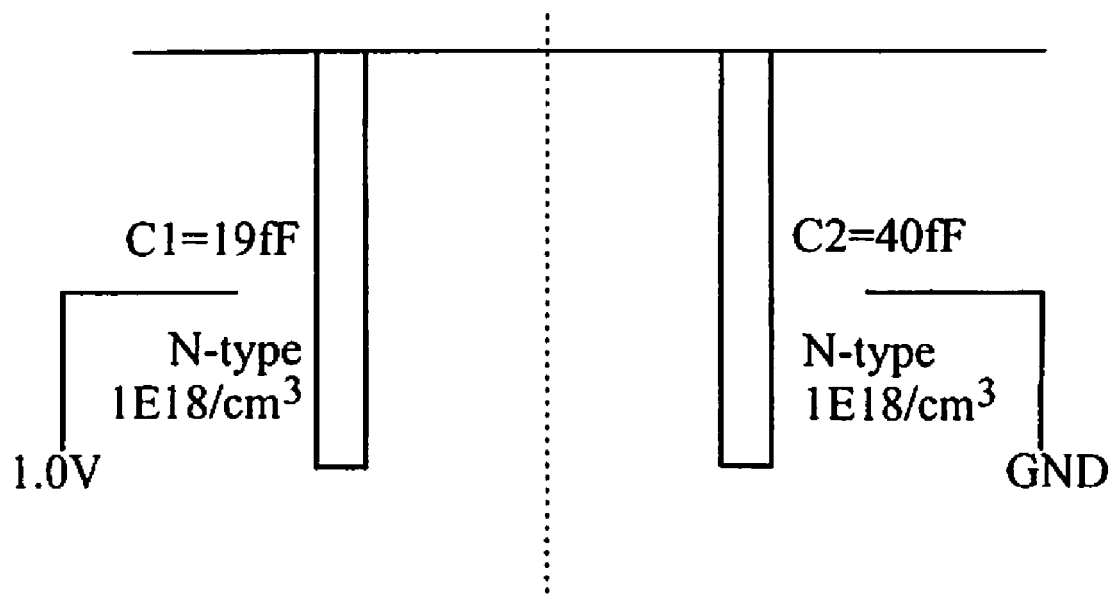

FIG. 4 is a diagram of two capacitors in a substrate, according to an embodiment of the invention.

Figure 5:
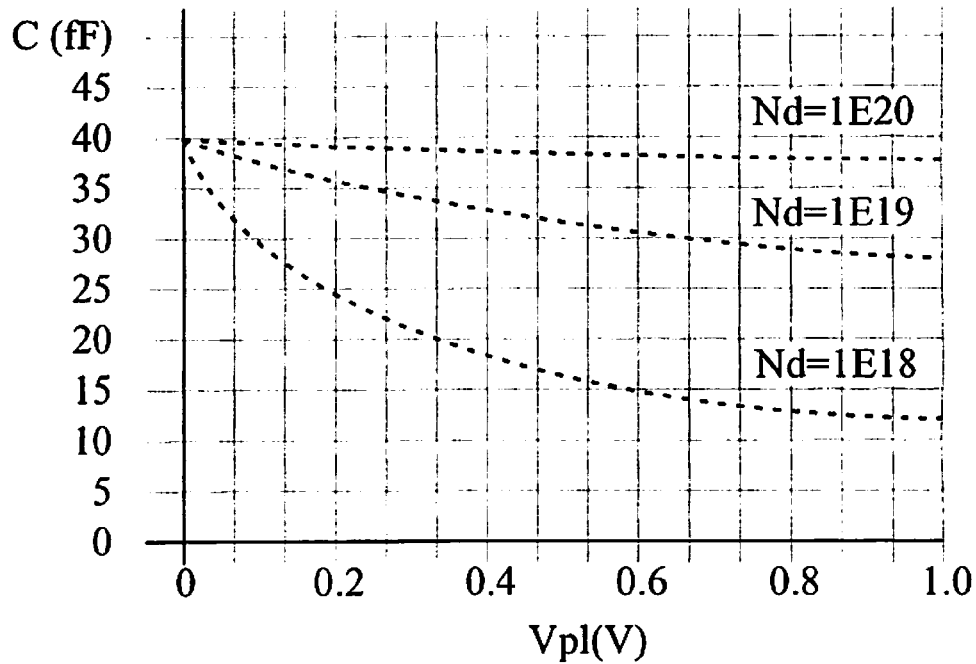

FIG. 5 is a graph of the behavior or a capacitor, depending on doping conditions, according to an embodiment of the invention.

Figure 6:
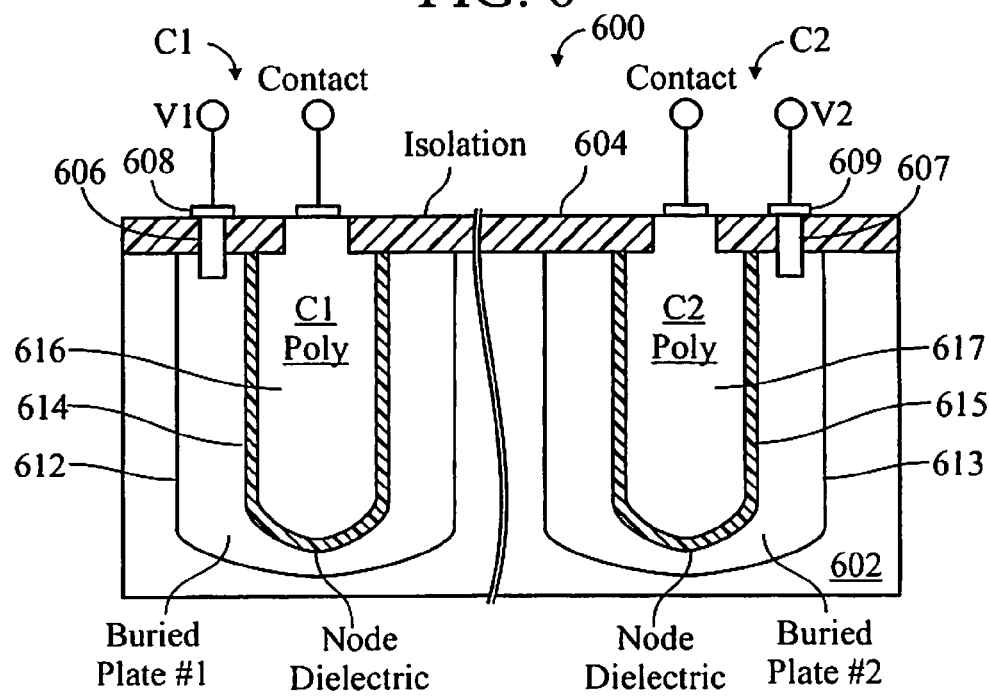

FIG. 6 is a cross-sectional view of two capacitors in a substrate, according to an embodiment of the invention.

DETAILED DESCRIPTION OF THE INVENTION

In the description that follows, numerous details are set forth in order to provide a thorough understanding of the present invention. It will be appreciated by those skilled in the art that variations of these specific details are possible while still achieving the results of the present invention. Well-known processing steps and materials are generally not described in detail in order to avoid unnecessarily obfuscating the description of the present invention.

Throughout the descriptions set forth in this disclosure, lowercase numbers or letters may be used, instead of subscripts. For example Vg could be written Vg. Generally, lowercase is preferred to maintain uniform font size.) Regarding the use of subscripts (in the drawings, as well as throughout the text of this document), sometimes a character (letter or numeral) is written as a subscript—smaller, and lower than the character (typically a letter) preceding it, such as "$V_s$," (source voltage) or "$H_2O$" (water). For consistency of font size, such acronyms may be written in regular font, without subscripting, using uppercase and lowercase—for example "Vs" and "H2O".

Materials (e.g., silicon dioxide) may be referred to by their formal and/or common names, as well as by their chemical formula. Regarding chemical formulas, numbers may be presented in normal font rather than as subscripts. For example, silicon dioxide may be referred to simply as "oxide", chemical formula $SiO_2$. For example, silicon nitride (stoichiometrically $Si_3N_4$, often abbreviated as "SiN") may be referred to simply as "nitride".

In the description that follows, exemplary dimensions may be presented for an illustrative embodiment of the invention. The dimensions should not be interpreted as limiting. They are included to provide a sense of proportion. Generally speaking, it is the relationship between various elements, where they are located, their contrasting compositions, and sometimes their relative sizes that is of significance.

The term "substrate" as used herein is intended to include a semiconductor substrate, a semiconductor epitaxial layer deposited or otherwise formed on a semiconductor substrate and/or any other type of semiconductor body, and all such structures are contemplated as falling within the scope of the present invention. For example, the semiconductor substrate may comprise a semiconductor wafer (e.g., silicon, SiGe, or an SOI wafer) or one or more die on a wafer, and any epitaxial layers or other type semiconductor layers formed thereover or associated therewith. A portion or entire semiconductor substrate may be amorphous, polycrystalline, or single-crystalline. In addition to the aforementioned types of semiconductor substrates, the semiconductor substrate employed in the present invention may also comprise a hybrid oriented (HOT) semiconductor substrate in which the HOT substrate has surface regions of different crystallographic orientation. The semiconductor substrate may be doped, undoped or contain doped regions and undoped regions therein. The semiconductor substrate may contain regions with strain and regions without strain therein, or contain regions of tensile strain and compressive strain.

Prior art trench DRAM/eDRAM capacitors generally have a heavily-doped buried plate. And, in a particular DRAM/eDRAM design, the plate voltage (Vp1) is commonly fixed, at either ground or at half of the supply voltage (Vdd).

According to the invention, generally, by modulating (controlling) plate doping and plate bias conditions, the DT capacitance can be modulated. For n+ poly on n+ plate case, only shallow depletion and accumulation are of practical interest. In accumulation mode, the capacitance is essentially the oxide capacitance, so the discussion is focused on the depletion mode.

Certain assumptions may be made herein, to illustrate the point. It may be assumed that Vp1=Vdd=1.0V. The DT capacitance can be plotted against the node voltage (Vn) for various plate doping levels. The oxide capacitance may be assumed to be 40fF, which is a typical value for deep trench DRAM/eDRAM.

As described in greater detail hereinbelow, (referencing the chart of FIG. 5), it can be observed that by lowering (limiting) the plate doping to 1E18 to 1E19 range, the DT capacitance can be modulated by a factor of about 2.

FIG. 3 shows, schematically, two capacitors C1 and C2 which may be formed, in the same microelectronic element, with substantially identical physical dimensions, using substantially identical processes. The capacitor C1 has a plate biased at a first voltage V1. The capacitor C2 has a plate biased at a first voltage V2.

FIG. 4 is a diagram of the two capacitors C1 and C2, formed in a substrate. Each capacitor has two electrodes separated by a dielectric layer (the dielectric layer is "sandwiched" between the two electrodes of the capacitor.

The capacitors C1 and C2 may extend into the substrate from a surface thereof, and may function as storage (cell) capacitors of DRAM/eDRAM cells having access transistors (not shown, see FIG. 2). The DRAM/eDRAM cells may be separated from one another by shallow trench isolation (STI; not shown, see FIG. 2). The cell capacitors C1 and C2 may each be formed in a deep trench (see FIG. 2) extending into the substrate.

Each cell capacitor generally comprises a first conductor called the "buried plate" which is a doped region (see 212) of the substrate surrounding the trench (see 210), a thin layer (see 214) of insulating material lining the trench, and a second conductor (see 216) such as a heavily doped polycrystalline plug (or "node", "DT poly") disposed within the trench (210). A cell transistor ("access transistor", not shown, see 220) may comprise a FET having one of its source/drain (S/D) terminals connected to (or an extension of) the second conductor (node) of the capacitor. The buried plate of the DRAM cell capacitor in FIG. 2 is described as being "heavily doped", and is representative of the prior art.

According to a feature of the invention, the buried plates of the capacitors C1 and C2 are "lightly doped". The doping concentration (in atoms of dopant per cubic centimeter, or $cm^{-3}$) for the buried plates of the capacitors is generally less than a maximum doping concentration, and is generally greater than a minimum doping concentration, including (for example):

less than $3E19\ cm^{-3}$
less than $1E19\ cm^{-3}$
less than $1E18\ cm^{-3}$
less than $1E17\ cm^{-3}$
between $1E13$ and $1E19\ cm^{-3}$
between $1E15$ and $1E19\ cm^{-3}$
between $1E17$ and $1E19\ cm^{-3}$
between $1E18$ and $1E19\ cm^{-3}$
between $1E13$ and $1E18\ cm^{-3}$
between $1E15$ and $1E18\ cm^{-3}$
between $1E17$ and $1E18\ cm^{-3}$
between $1E13$ and $1E18\ cm^{-3}$
between $1E15$ and $1E17\ cm^{-3}$ The buried plates may be formed by any suitable process such as, Ion implantation
Plasma doping
Gas phase doping
Solid phase doping
Liquid phase doping nd the dopants may be conventional dopants such as arsenic or phosphorous (for N-type) and boron or indium (for P-type).

In the prior art, it is known to have capacitors with different capacitance values, for different applications. For example, see US Patent Publication No 2005/0280063, described hereinabove. In that reference, the poly nodes of two capacitors have different sizes (depths), which required additional process steps.

According to a feature of the invention, the two capacitors C1 and C2 may have substantially the same structure, particularly dimensions, and are formed using substantially the same process steps, without requiring an additional step for one capacitor beyond the steps required to form the other capacitor.

In the prior art, when there are a plurality of cell capacitors, the plate voltages (Vp1) is usually established at ground potential (0V), and all of the plate voltages are the same.

According to a feature of the invention, the capacitors C1 and C2 may be biased at different plate voltages (Vp1). For example, the capacitor C1 may be biased to 1.0V (Vp1=1.0V), and the capacitor C2 may be at ground potential (Vp1=GND; 0V). The difference in plate voltage (Vp1) between the two capacitors may be:
- at least 0.5 V
- at least 0.6 V
- at least 0.7 V
- at least 0.8V
- at least 0.9 V
- at least 1.0 V
- between 0.5V and 1.0V According to the invention, generally, two (or more) capacitors, C1 and C2, including two or more sets (pluralities) of capacitors, such as deep trench capacitors for DRAM/eDRAM, may be formed substantially physically identical to one another, all of the capacitors having lightly doped buried plates, the two capacitors being biased at different plate voltages, to achieve a substantial difference (ratio) in capacitance of the two capacitors, such the capacitance of one of the capacitors is "X" times the capacitance of the other of the two capacitors, where:
- "X" is at least 2.0
- "X" is at least 1.7
- "X" is at least 1.5
- "X" is at least 1.2

FIG. 5 is a graph illustrating capacitance of the capacitors in femtoFarads (fF) versus bias voltage Vp1 for a deep trench capacitor. The vertical axis is capacitance (C), measured in femtoFarads (fF). The horizontal axis is plate voltage (Vp1). Node voltage (Vnode=0.0 V)

The capacitance is plotted for three different n-type doping concentrations (Nd),
- Nd=1E20 ("heavily doped")
- Nd=1E19 ("lightly doped")
- Nd=1E18 ("lightly doped")

It can be observed from the graph that the capacitance decreases with decreasing doping concentration. For example, at 1V,
- with Nd=1E20, the capacitance is=~38fF
- with Nd=1E19, the capacitance is=~27fF
- with Nd=1E18, the capacitance is=~12fF It can be observed from the graph that the capacitance for all three plotted doping concentrations converge to =~40fF at 0V.

It can be observed from the graph that the capacitance for the "heavily doped" (1E20) capacitor is substantially flat, across the voltage range (from 1V to 0V), from =~38fF to =~40fF.

It can be observed from the graph that the capacitance for the "lightly doped" (1E19) capacitor increases slightly, across the voltage range (from 1V to 0V), from =~28fF to =~40fF.

It can be observed from the graph that the capacitance for the "lightly doped" (1E18) capacitor increases more than slightly, across the voltage range (from 1V to 0V), from =~12fF to =40fF.

Thus, it is evident, that by controlling the bias (plate) voltage of two different capacitors (or sets of capacitors), the capacitances of those capacitors can be controlled (modulated) not only to be substantially different than one another (up to at least "2×", as described above), but also can be established at a desired capacitance value, such as by the end-user, depending on the application.

It is within the scope of the invention that the bias voltage, hence capacitance value for a given capacitor (or set of capacitors) can be changed, from time-to-time, within a given application, depending on operational requirements.

It is within the scope of the invention that, as an alternative to or in addition to modulating the bias voltage for the capacitors, the doping concentration, hence capacitance value for a given capacitor (or set of capacitors) can be established to be different than the doping concentration for another capacitor (or set of capacitors).

FIG. 6 is a cross-sectional view of a microelectronic element 600 having two capacitors, C1 and C2, which are deep trench type capacitors, such as for DRAM/eDRAM, formed in a substrate. 602 (compare 202, FIG. 2). The substrate 602 may be a bulk or an SOI substrate.

Generally, for each capacitor a deep trench (DT, compare 210, FIG. 2) is formed, extending into the substrate 602, from a top (as viewed) surface thereof. The trench may have a width of about 50 nm to 200 nm and a depth of 1000 nm to 10000 nm, by way of example.

The cell capacitor generally comprises a first conductive element called the "buried plate" which is a doped region (compare 212, FIG. 2) of the substrate surrounding the trench, a thin layer (compare 214, FIG. 2) of insulating material lining the trench and referred to as "node dielectric", and a second conductive element (compare 216, FIG. 2) such as a heavily doped polycrystalline plug (or "node", "DT poly") disposed within the trench. The buried plate of C1 is labeled 612, the buried plate of C2 is labeled 613. The node dielectric of C1 is labeled 614, the node dielectric of C2 is labeled 615. The node of C1 is labeled 616, the node of C2 is labeled 617.

The "C1 poly"/"C2 poly" can be any conductor, such as polycrystalline or amorphous silicon, germanium, silicon germanium, a metal (e.g., tungsten, titanium, tantalum, ruthenium, cobalt, copper, aluminum, lead, platinum, tin, silver, gold), a conducting metallic compound material (e.g., tantalum nitride, titanium nitride, tungsten silicide, tungsten nitride, titanium nitride, tantalum nitride, ruthenium oxide, cobalt silicide, nickel silicide), carbon nanotube, conductive carbon, or any suitable combination of these materials.

The "node dielectric" can be any dielectric, including but not limited to, silicon oxide, silicon nitride, silicon oxynitride, high-k material, and any combination of these materials. Examples of high-k material include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate, an any combination of these materials.

A cell transistor ("access transistor", not shown, see 220, FIG. 2) may comprise a FET having one of its source/drain (S/D) terminals connected to (or an extension of) the second conductor (node) of a respective one of the capacitors.

In modern CMOS technology, shallow trench isolation (STI) is commonly used to isolate one (or more) transistors from other transistors, for both logic and memory. A shallow trench (not shown, see 232, FIG. 2) may be formed, surrounding the access transistor and associated capacitor, thereby isolating one DRAM/eDRAM cell from another. Alternatively, the isolation trench may extend deeper than the buried plates of the capacitors. The shallow (or deep) isolation trench may be filled with an insulating material, such as oxide.

A layer of isolation 604 such as oxide and/or nitride may be disposed on the surface of the substrate 602.

There is an opening in the isolation 604 above the poly node for C1, so that contact may be made to the poly node of C1 ("C1 Poly"). Alternatively, a source or drain diffusion of an FET formed on the substrate may be in contact with the poly node, such as is illustrated in FIG. 2.

Similarly, there is an opening in the isolation 604 above the poly node for C2, so that contact may be made to the poly node of C2 ("C2 Poly").

There is another opening in the isolation 604, above the buried plate for C1, so that contact may be made to the buried plate of C1 (Buried Plate #1). This is shown as a contact plug 606 extending through the opening and metallization 608 on the surface of the isolation. In this manner, a bias voltage V1 may be applied to the buried plate of C1.

Similarly, there is another opening in the isolation 604, above the buried plate for C2, so that contact may be made to the buried plate of C2 (Buried Plate #2). And, a comparable contact plug 607 extending through the isolation and metallization 609 on the surface of the isolation are shown. In this manner, a bias voltage V2 may be applied to the buried plate of C2.

The structure shown in FIG. 6 may comprise other elements (not shown) such as elements for isolation and/or electrically connection. By adjusting (modulating) the bias voltages V1 and V2, the capacitances of the two capacitors C1 and C2 can be adjusted to be up to at least 2 times ("2×") different than one another, after the product is fabricated (process independent).

The invention may be implemented in a semiconductor manufacturing system, and the design structure disclosed herein (having capacitors with lightly-doped plates, biased differently, to modulate capacitance) may be embodied in a machine readable medium for designing, manufacturing, or testing a design. The design structure may comprise a netlist, which describes the design. The design structure may reside on a storage medium as a data format used for the exchange of layout data of integrated circuits. The design structure may include at least one of test data files, characterization data, verification data, and design specifications.

Although the invention has been shown and described with respect to a certain preferred embodiment or embodiments, certain equivalent alterations and modifications will occur to others skilled in the art upon the reading and understanding of this specification and the annexed drawings. In particular regard to the various functions performed by the above described components (assemblies, devices, circuits, etc.) the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more features of the other embodiments as may be desired and advantageous for any given or particular application.

What is claimed is:
1. A microelectronic element comprising:
a semiconductor substrate;
a first capacitor comprising a trench formed in the substrate, a first buried plate surrounding the trench, a node dielectric lining the trench, and a node disposed within the trench, and wherein the first buried plate has a first doping concentration;
a second capacitor comprising a trench formed in the substrate, a second buried plate surrounding the trench, a node dielectric lining the trench, and a node disposed within the trench, and wherein the second buried plate has a second doping concentration;
a first contact plug directly connected to the first buried plate for applying a first bias voltage to the first buried plate;
a second contact plug directly connected to the second buried plate for applying a second bias voltage, different than the first bias voltage, to the second buried plate; and
the semiconductor substrate having a non-uniform doping concentration wherein the first doping concentration differs from the second doping concentration by at least one order of magnitude.
2. The microelectronic element of claim 1, wherein:
the first doping concentration is between 1E13 and 1E18 atoms per cubic centimeter, and
wherein the second doping concentration is greater than 1E19 atoms per cubic centimeter.
3. The microelectronic element of claim 2, wherein:
the first doping concentration is less than 1E17 atoms per cubic centimeter.
4. The microelectronic element of claim 3, wherein:
the first doping concentration is between 1E13 and 1E18 atoms per cubic centimeter.
5. The microelectronic element of claim 2, wherein:
the second doping concentration is between 1E19 and 1E20 atoms per cubic centimeter.
6. The microelectronic element of claim 3, wherein:
the first doping concentration is between 1E17 and 1E18 atoms per cubic centimeter.
7. The microelectronic element of claim 1, wherein:
the capacitance of the first capacitor is at least 2.0 times the capacitance of the second capacitor.
8. The microelectronic element of claim 1, wherein:
the capacitance of the first capacitor is at least 1.2 times the capacitance of the second capacitor.
9. The microelectronic element of claim 1, wherein:
a voltage difference between the biases of the buried plates of the first capacitor and the second capacitor is at least 0.5V; and
the capacitance of the first capacitor at least 1.2 times the capacitance of the second capacitor.
10. The microelectronic element of claim 1, wherein:
the first and second capacitors are deep trench capacitors and are separated from one another by a layer of isolation disposed on the surface of the substrate.
11. The microelectronic element of claim 1, wherein:
the first and second capacitors are storage capacitors of DRAM/eDRAM cells.

* * * * *